(12) United States Patent
Tanoue

(10) Patent No.: US 7,366,962 B2
(45) Date of Patent: Apr. 29, 2008

(54) INTERLEAVING/DEINTERLEAVING METHOD AND APPARATUS

(75) Inventor: Kazufumi Tanoue, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 581 days.

(21) Appl. No.: 10/812,963

(22) Filed: Mar. 31, 2004

(65) Prior Publication Data

US 2004/0199845 A1    Oct. 7, 2004

(30) Foreign Application Priority Data

Apr. 7, 2003    (JP)    ............... 2003-102918

(51) Int. Cl.
*G11C 29/00*    (2006.01)
(52) U.S. Cl. .................................... 714/702
(58) Field of Classification Search ................ 714/702
See application file for complete search history.

(56) References Cited

U.S. PATENT DOCUMENTS 5,566,183 A * 10/1996 Partyka ...................... 714/701
5,742,612 A *  4/1998 Gourgue et al. ............ 714/701

FOREIGN PATENT DOCUMENTS

| JP | 598440  | 1/1984 |
| JP | 2999101 | 2/1995 |

* cited by examiner

*Primary Examiner*—Shelly A Chase
(74) *Attorney, Agent, or Firm*—Dickinson Wright, PLLC

(57) ABSTRACT

An interleaving/deinterleaving method and apparatus may interleave/deinterleave first data to produce second data so that the arrangement of data elements of the second data is different from that of the first data. To accomplish this, word data that are part of the first data are read from a data storage section and a data element to be processed is selected from the word data for output. The operations of reading word data and selecting data elements of the word data to output are repeated, and a sequence of data elements to be processed at the time of repetition is determined in accordance with the arrangement of the data elements of the second data.

9 Claims, 14 Drawing Sheets

FIG. 5

| Address | bit7 | bit6 | bit5 | bit4 | bit3 | bit2 | bit1 | bit0 |
|---|---|---|---|---|---|---|---|---|
| 100 | d0 | d1 | d2 | d3 | d4 | d5 | d6 | d7 |
| 101 | d8 | d9 | d10 | d11 | d12 | d13 | d14 | d15 |
| 102 | d16 | d17 | d18 | d19 | d20 | d21 | d22 | d23 |
| 103 | d24 | d25 | d26 | d27 | d28 | d29 | d30 | d31 |
| ⋮ | ⋮ | ⋮ | ⋮ | ⋮ | ⋮ | ⋮ | ⋮ | ⋮ |
| 300 | d0 | d4 | d8 | d12 | d16 | d20 | d24 | d28 |
| 301 | d1 | d5 | d9 | d13 | d17 | d21 | d25 | d29 |
| 302 | d2 | d6 | d10 | d14 | d18 | d22 | d26 | d30 |
| 303 | d3 | d7 | d11 | d15 | d19 | d23 | d27 | d31 |

FIG. 6

| Address | Address information | Bit position information |
|---|---|---|
| 0 | 100 | bit7 |
| 1 | 100 | bit3 |
| 2 | 101 | bit7 |
| 3 | 101 | bit3 |
| 4 | 102 | bit7 |
| 5 | 102 | bit3 |
| 6 | 103 | bit7 |
| 7 | 103 | bit3 |
| 8 | 100 | bit6 |
| ⋮ | ⋮ | ⋮ |

FIG. 7

| Address | | bit7 | bit6 | bit5 | bit4 | bit3 | bit2 | bit1 | bit0 |
|---|---|---|---|---|---|---|---|---|---|
| 100 | | d0 | d1 | d2 | d3 | d4 | d5 | d6 | d7 |
| 101 | | d8 | d9 | d10 | d11 | d12 | d13 | d14 | d15 |
| 102 | | d16 | d17 | d18 | d19 | d20 | d21 | d22 | d23 |
| 103 | | d24 | d25 | d26 | d27 | d28 | d29 | d30 | d31 |
| ⋮ | | ⋮ | ⋮ | ⋮ | ⋮ | ⋮ | ⋮ | ⋮ | ⋮ |
| 300 | | d0 | d8 | d16 | d24 | d1 | d9 | d17 | d25 |
| 301 | | d2 | d10 | d18 | d26 | d3 | d11 | d19 | d27 |
| 302 | | d4 | d12 | d20 | d28 | d5 | d13 | d21 | d29 |
| 303 | | d6 | d14 | d22 | d30 | d7 | d15 | d23 | d31 |

FIG. 8

| Address | Address information | Bit position information |
|---|---|---|
| 0 | 100 | bit7 |
| 1 | 101 | bit7 |
| 2 | 102 | bit7 |
| 3 | 103 | bit7 |
| 4 | 100 | bit6 |
| 5 | 101 | bit6 |
| 6 | 102 | bit6 |
| 7 | 103 | bit6 |
| 8 | 100 | bit5 |
| ⋮ | ⋮ | ⋮ |

FIG. 9

| Address | Address information | Bit position information |
|---------|---------------------|--------------------------|
| 0 | 300 | bit7 |
| 1 | 301 | bit7 |
| 2 | 302 | bit7 |
| 3 | 303 | bit7 |
| 4 | 300 | bit6 |
| 5 | 301 | bit6 |
| 6 | 302 | bit6 |
| 7 | 303 | bit6 |
| 8 | 300 | bit5 |
| ⋮ | ⋮ | ⋮ |

FIG. 10

| Address | Address information | Bit position information |
|---|---|---|
| 0 | 300 | bit7 |
| 1 | 300 | bit3 |
| 2 | 301 | bit7 |
| 3 | 301 | bit3 |
| 4 | 302 | bit7 |
| 5 | 302 | bit3 |
| 6 | 303 | bit7 |
| 7 | 303 | bit3 |
| 8 | 300 | bit6 |
| ⋮ | ⋮ | ⋮ |

FIG. 11

| Step | Processing |
|------|------------|
| step0 | First pointer 30 ← address information<br>Second pointer 22 ← second pointer 22 + 1 |
| step1 | Setting of the number of repetitions |
| step2 | Shift register 50 ← selection of specific bit of<br>        1-word data stored in data storage means 10 (at<br>        address designated by first pointer 30)<br>First pointer 30 ← address information<br>Second pointer 22 ← second pointer 22 + 1<br>Return to step 2 |
| step3 | Data storage means 10 (at address designated by<br>third pointer 60) ← shift register 50<br>Third pointer 60 ← third pointer 60 + 1 |
| Step4 | Return to step 1 |

FIG. 12

| Step | Processing |
|---|---|
| step0 | Setting of the number of repetitions (1)<br>Third pointer 60 ← head address of processed data storage area |
| step1 | Data storage means 10 (at address designated by<br>third pointer 60) ← x'00<br>Third pointer 60 ← third pointer 60 + 1<br>Return to step 1 |
| step2 | Third pointer 60 ← address information<br>Second pointer 22 ← second pointer 22 + 1 |
| step3 | Shift register 50 ← 1-word data stored in data storage means 10 (at<br>                  address designated by first pointer 30)<br>First pointer 30 ← first pointer 30 + 1 |
| step4 | Setting of the number of repetitions (2) |
| step5 | Data storage means 10 (at address designated by third pointer 60)<br>← Setting of data element output from shift register in specific bit of<br>1-word data stored in data storage 10 (at address designated by third<br>pointer 60)<br>Third pointer 60 ← address information<br>Second pointer 22 ← second pointer 22 + 1<br>Return to step 5 |
| step6 | Return to step 3 |

FIG. 14

RELATED ART

| Step | | Processing |
|---|---|---|
| step0 | | Third pointer 60 ← address information |
| step1 | | r1 ← data storage means 10 (at address designated by first pointer 30)<br>First pointer 30 ← first pointer 30 + 1 |
| step2 | | Setting of the number of repetitions |
| step3 | | r0 ← setting of flag of latch 240 in specific bit of 1-word data stored in data storage means 10 (at address designated by third pointer 60)<br>Second pointer 22 ← second pointer 22 + 1 |
| step4 | | Data storage means 10 (at address designated by third pointer 60) ← r0 |
| step5 | | r1 ← shifting of data in r1 to higher-order bits by one bit<br>Third pointer 60 ← address information<br>Return to step 3 |
| step6 | | Return to step 1 |

INTERLEAVING/DEINTERLEAVING METHOD AND APPARATUS

BACKGROUND OF THE INVENTION

1. Field of the Invention

The present invention relates to a method and an apparatus for interleaving/deinterleaving transmission/reception data in bit units in the field of information communication.

2. Prior Art

Conventionally, an interleaving apparatus interleaved data in word units, since data was read from storage means in word units. However, when a burst error occurred, interleaving in word units had a defect of causing many errors in one word.

Hence, an apparatus for interleaving data in bit units has been proposed in Japanese Patent No. 2999101 (Japanese Laid-open Patent Application No. Hei 07-049779). This interleaving apparatus sequentially reads data elements before interleaving, interleaves the data, carries out a logical operation of the data and the data (interleaving intermediate data in the middle of the processing) stored in the storage area, in which interleaved data is to be stored, of the storage means, and then stores the interleaved data at the same address of the storage means. The interleaving apparatus carries out the above-mentioned processing, thereby attaining interleaving. The interleaving apparatus described in Japanese Patent No. 2999101 (Japanese Laid-open Patent Application No. Hei 07-049779) is hereafter taken as a conventional example, and its configuration and operation will be described in detail below by using FIGS. 13 and 14.

FIG. 13 is a schematic diagram showing the interleaving apparatus in accordance with the conventional example. Numeral 10 designates data storage means, numeral 20 designates access information supply means, numeral 30 designates a first pointer, numeral 60 designates a third pointer, numeral 200 designates a multiplexer, numeral 210 designates logical operation means, numeral 220 designates a 1-bit shifter, numeral 230 designates a register, numeral 240 designates a latch, and numeral 250 designates control means.

The reception data stored in the data storage means 10 is read in word units by the first pointer 30 in accordance with the sequence of addresses and stored in r1 of the register 230. At that time, the data element in the most significant bit is stored in the latch 240.

The access information supply means 20 stores address information and bit position information, respectively regarding addresses and bits in which interleaved data elements are stored, in address storage means 21 in accordance with the sequence of addresses obtained before interleaving. The address information is output to the third pointer 60, and 1-word data is read from the address designated by the third pointer 60. The bit position information is output to the control means 250. When the data element stored in the latch 240 is 0, the control means 250 outputs 1-word data wherein the value in the bit position designated by the bit position information is 0 and the values at the other bit positions are 1. The logical operation means 210 computes the AND of the 1-word data of the control means 250 with the 1-word data read from the address designated by the third pointer 60 and stores the AND in r0. On the other hand, when the data element stored in the latch 240 is 1, the control means 250 outputs 1-word data wherein the value in the bit position designated by the bit position information is 1 and the values at the other bits are 0. The logical operation means 210 computes the OR of the 1-word data of the control means 250 with the 1-word data read from the address designated by the third pointer 60 and stores the OR in r0. The data stored in r0 is written in the data storage means 10. Hence, among the data elements in the 1-word data stored at the address designated by the third pointer 60, only the data element in the bit corresponding to the bit position information is rewritten to the data element stored in the latch 240, whereby the data in the data storage means 10 is overwritten.

Then, the data in r1 is shifted to higher-order bits by one bit and stored again in r1, and the data element in the most significant bit is stored in the latch 240. The above-mentioned procedure is repeated. When the procedure is completed for all the data elements of the 1-word data stored in r1, 1-word data is read again from the address designated by the first pointer 30, and the above-mentioned procedure is repeated. Interleaving ends when the procedure is completed for all the reception data.

FIG. 14 is a table illustrating a program in accordance with the conventional example. At step 0, the address information supplied by the access information supply means 20 is set in the third pointer 60. At step 1, the 1-word data at the address designated by the first pointer 30 is stored in r1, the data element in the most significant bit is stored in the latch 240, and the first pointer 30 is incremented by one. At step 2, the number of repetitions is set at a number so that the processing is repeated by the number corresponding to the bit width of one word. At step 3, the 1-word data stored at the address, designated by the third pointer 60, of the data storage means 10 is read, the data element held in the latch 240 is set in the bit position designated by the bit position information, and the obtained data is stored in r0, and a second pointer 22 is incremented by one. At step 4, the 1-word data in r0 is transferred to the address, designated by the third pointer 60, of the data storage means 10. At step 5, the data in r1 is shifted to higher-order bits by one bit and stored in r1. The data element in the most significant bit is stored in the latch 240, the next address information is set in the third pointer 60. If the number of repetitions is not more than the preset number, the procedure returns to step 3. If the number of repetitions is more than the preset number, step 6 is then carried out. At step 6, if interleaving has not been carried out for all the data elements, the procedure returns to step 1. If interleaving has been carried out, the program ends. The program comprises the above-mentioned processing steps.

Deinterleaving is carried out in accordance with a procedure similar to that described above, since deinterleaving is different from interleaving only in the address information and the bit position information stored in the address storage means 21.

However, in the conventional example, the addresses and bit positions, in which interleaved data elements are stored, of the data storage means 10 are not continuous. Hence, in order to store one data element, it is necessary to carry out a logical operation with the interleaving intermediate data at the address of the storage destination. In addition, the processing by the logical operation means 210 must be switched depending on whether the data element is 0 or 1. This has a problem of making the size of the circuit larger and making the logical operation more complicated. Furthermore, it is necessary to write 1-word data in the data storage means 10 each time 1-bit data is interleaved. This has a problem of increasing the number of processing steps and the number of the total processing steps of the program.

Moreover, problems similar to those described above occur in the case of deinterleaving, since deinterleaving is different from interleaving only in the address information and the bit position information stored in the address storage means 21.

Still further, in order that selection is made between interleaving and deinterleaving in the conventional example, there is a problem of requiring that the address information and the bit position information are rewritten.

SUMMARY OF THE INVENTION

The present invention is intended to provide an interleaving/deinterleaving method and apparatus capable of avoiding complicated logical operation processing and of reducing the size of the circuit and the number of processing steps, and further intended to provide an interleaving/deinterleaving apparatus capable of making the rewriting of address information and bit position information for selection between interleaving and deinterleaving unnecessary.

A first interleaving/deinterleaving method in accordance with the present invention for interleaving/deinterleaving first data stored in data storage means to second data so that the arrangement of the data elements of the second data is different from the arrangement of the data elements of the first data, comprises a first step of reading word data, part of the first data, from the data storage means, and a second step of selecting a data element to be processed from the word data read and of outputting the selected data element, the first step and the second step being repeated, wherein the sequence of the data elements to be processed at the time of the repetition is determined in accordance with the arrangement of the data elements of the second data.

A second interleaving/deinterleaving method in accordance with the present invention for interleaving/deinterleaving first data stored in data storage means to second data so that the arrangement of the data elements of the second data is different from the arrangement of the data elements of the first data in bit units, comprises a first step of reading word data, part of the first data, from the data storage means, a second step of selecting a data element to be processed from the word data read and of outputting the selected data element, a third step of shifting a bit sequence having already been stored in a shift register by one bit and of storing the data element selected and output in the shift register, and a fourth step of storing the bit sequence stored in the shift register in the data storage means after the processing from the first step to the third step is repeated by a predetermined number of times, wherein the sequence of the data elements to be processed at the time of the repetition of the processing from the first step to the third step is determined in accordance with the arrangement of the data elements of the second data.

In the above-mentioned first and second interleaving/deinterleaving methods, interleaving/deinterleaving is carried out in units of data elements in sequence in consideration of the arrangement of data elements after interleaving/deinterleaving instead of before interleaving/deinterleaving. With this method, the processed data can be output sequentially without being further processed at all. Hence, logical operation processing required in the conventional example becomes unnecessary. It is thus possible to reduce the size of the circuit, the number of the processing steps and the number of the total processing steps of the program.

In the second interleaving/deinterleaving method, in order that the processed second data is stored once in the data storage means, a shift register having the data width of at least one word is provided, and after the data elements of one word are stored in the shift register, the data elements are written in the data storage means.

A third interleaving/deinterleaving method in accordance with the present invention for interleaving/deinterleaving first data stored in data storage means to second data so that the arrangement of the data elements of the second data is different from the arrangement of the data elements of the first data, comprises a step of initializing an area, in which the second data is stored, of the data storage means, a step of reading word data, part of the first data, from the data storage means in accordance with the arrangement of the data elements of the first data and of storing the word data in a shift register, a step of sequentially shifting out the word data stored in the shift register beginning with the data element positioned in the most significant bit position, a step of generating first word data by positioning the data element shifted out at a bit position in word data serving as the second data and by expanding the data element to word data, a step of reading as second word data the word data stored at the address, in which the data element shifted out should be stored, of the data storage means, a step of computing the OR of the first word data with the second word data, and a step of storing the OR at the address, from which the second word data is read, in the data storage means.

In the third interleaving/deinterleaving method, interleaving/deinterleaving is carried out in the sequence of the data elements before interleaving/deinterleaving just as in the case of the conventional example. The address information and the bit position information supplied by access information supply means designate the address and the bit position in which the word data serving as the second data should be stored. However, by previously initializing an area in which interleaved/deinterleaved data should be stored, it is possible to uniformly "set 0 at bit positions other than the bit position to which the corresponding data element is output" as a data expansion method. Furthermore, logical operation processing can be limited to logical OR processing. Hence, in comparison with the conventional example, logical operation processing can be simplified, the size of the circuit can be reduced, and the total processing steps can be reduced.

In addition, a first interleaving/deinterleaving apparatus in accordance with the present invention for interleaving/deinterleaving first data to second data so that the arrangement of the data elements of the second data is different from the arrangement of the data elements of the first data, comprises data storage means for storing the first data, access information supply means for sequentially supplying the address information of word data, part of the first data, in the data storage means and the bit position information of the data element to be processed in the word data, and data selection means for receiving the word data read from the address, corresponding to the address information, of the data storage means, for selecting one data element from the word data on the basis of the bit position information and for outputting the data element, wherein the address information and the bit position information supplied sequentially by the access information supply means are determined in accordance with the arrangement of the data elements of the second data.

The first interleaving/deinterleaving apparatus may be configured so as to be characterized in that the data elements are processed in bit units, that a shift register for sequentially shifting, by one bit, a bit sequence having already been stored and for sequentially storing a 1-bit data element sequentially output from the data selection means is further provided, and that when the bit width of the bit sequence stored in the shift register reaches a predetermined bit width, not smaller than the bit width of at least 1-word data, the bit sequence is stored as part of the second data in the data storage means.

The first interleaving/deinterleaving apparatus may be configured so as to be characterized in that the data selection means comprises a shifter, that the word data read from the data storage means is shifted so that the data element to be selected is positioned at a specific bit position, and that the output from the specific bit position after the shifting is used as the output of the data selection means.

In the first interleaving/deinterleaving apparatus described above, interleaving/deinterleaving is carried out in units of data elements in sequence in consideration of the arrangement of data elements after interleaving/deinterleaving instead of before interleaving/deinterleaving. With this method, the processed data can be output sequentially without being further processed at all. Hence, logical operation processing required in the conventional example becomes unnecessary. It is thus possible to reduce the size of the circuit, the number of the processing steps and the number of the total processing steps of the program. The sequence of data elements to be interleaved/deinterleaved should only be held in the access information supply means for supplying address information designating the address, at which word data, part of the first data, is stored, in the data selection means and bit position information designating a bit position in the word data.

Furthermore, in order that the processed second data is stored once in the data storage means, a shift register having the bit width of at least one word should only be provided, and after the data elements of one word are stored in the shift register, the data elements should only be written in the data storage means.

A second interleaving/deinterleaving apparatus in accordance with the present invention for interleaving/deinterleaving first data to second data so that the arrangement of the data elements of the second data is different from the arrangement of the data elements of the first data, comprises data storage means for storing the first data and the second data, access information supply means for supplying the address information of word data, part of the second data, in the data storage means and the bit position information of the data element to be processed in the word data, a shift register for storing word data, part of the first data, read from the data storage means in accordance with the arrangement of the data elements of the first data and for sequentially shifting out the word data beginning with the data element positioned in the most significant bit position, data expansion means for sequentially expanding the data element shifted out sequentially from the shift register on the basis of the bit position information to word data and for outputting the word data, and logical OR means for computing the OR of the word data read from the address, corresponding to the address information, of the data storage means with the word data output from the data expansion means and for outputting the OR, wherein the OR output from the logical OR means is stored at the address, corresponding to the address information, from which the word data is read, of the data storage means, and the address information and the bit position information supplied sequentially by the access information supply means are determined in accordance with the arrangement of the data elements of the first data.

The second interleaving/deinterleaving apparatus may be configured so as to be characterized in that the data expansion means comprises a shifter, that the data element shifted out from the shift register is shifted so as to be positioned in the bit position corresponding to the bit position information, that 0 is set in the bits higher and lower than the bit position corresponding to the bit position information, and that the obtained data is output as word data.

In the above-mentioned second interleaving/deinterleaving apparatus, interleaving/deinterleaving is carried out in the sequence of the data elements before interleaving/deinterleaving just as in the case of the conventional example. The address information and the bit position information supplied by access information supply means designate the address and the bit position in which the word data serving as the second data should be stored. However, by previously initializing an area in which interleaved/deinterleaved data should be stored, it is possible to uniformly "set 0 at bit positions other than the bit position to which the corresponding data element is output" as a data expansion method. Furthermore, logical operation processing can be limited to logical OR processing. Hence, in comparison with the conventional example, logical operation processing can be simplified, the size of the circuit can be reduced, and the total processing steps can be reduced.

A third interleaving/deinterleaving apparatus in accordance with the present invention for interleaving/deinterleaving first data to second data so that the arrangement of the data elements of the second data is different from the arrangement of the data elements of the first data, comprises data storage means for storing the first data and the second data, and access information supply means for supplying address information and bit position information, wherein the address information designates the address of word data, part of the second data, in the data storage means at the time of interleaving or designates the address of word data, part of the first data, in the data storage means at the time of deinterleaving, and the bit position information designates the bit position of the data element to be processed in the word data, part of the second data, at the time of interleaving or designates the bit position of the data element to be processed in the word data, part of the first data, at the time of deinterleaving.

The third interleaving/deinterleaving apparatus may comprise a shift register for storing word data, part of the first data, read from the data storage means in accordance with the arrangement of the data elements of the first data and for sequentially shifting out the word data beginning with the data element positioned in the most significant bit at the time of interleaving, data selection expansion means for sequentially expanding the data element shifted out sequentially from the shift register on the basis of the bit position information to word data and for outputting the word data at the time of interleaving, and logical OR means for computing the OR of the word data read from the address, corresponding to the address information, of the data expansion means with the word data output from the data selection expansion means and for outputting the OR at the time of interleaving, wherein the OR output from the logical OR means is stored at the address, corresponding to the address information, from which the word data is read, of the data expansion means, the data selection expansion means receives the word data read from the address, corresponding to the address information, of the data expansion means, selects one data element from the word data on the basis of the bit position information and outputs the data element at the time of deinterleaving, and the shift register sequentially shifts, by one bit, a bit sequence having already been stored and sequentially stores a 1-bit data element sequentially output from the data selection expansion means at the time of deinterleaving; when the bit width of the bit sequence stored in the shift register reaches a predetermined bit width, not smaller than the bit width of at least 1-word data, the bit sequence is stored as part of the second data in the data storage means.

A fourth interleaving/deinterleaving apparatus in accordance with the present invention for interleaving/deinterleaving first data to second data so that the arrangement of the data elements of the second data is different from the arrangement of the data elements of the first data, comprises data storage means for storing the first data and the second data, and access information supply means for supplying address information and bit position information, wherein the address information designates the address of word data, part of the second data, in the data storage means at the time of deinterleaving or designates the address of word data, part of the first data, in the data storage means at the time of interleaving, and the bit position information designates the bit position of the data element to be processed in word data, part of the second data, at the time of deinterleaving or designates the bit position of the data element to be processed in word data, part of the first data, at the time of interleaving.

The fourth interleaving/deinterleaving apparatus may comprise a shift register for storing word data, part of the first data, read from the data storage means in accordance with the arrangement of the data elements of the first data and for sequentially shifting out the word data beginning with the data element positioned in the most significant bit at the time of deinterleaving, data selection expansion means for sequentially expanding the data element shifted out sequentially from the shift register on the basis of the bit position information to word data and for outputting the word data at the time of deinterleaving, and logical OR means for computing the OR of the word data read from the address, corresponding to the address information, of the data expansion means with the word data output from the data selection expansion means and for outputting the OR at the time of deinterleaving, wherein the OR output from the logical OR means is stored at the address, corresponding to the address information, from which the word data is read, of the data expansion means, the data selection expansion means receives the word data read from the address, corresponding to the address information, of the data expansion means, selects one data element from the word data on the basis of the bit position information and outputs the data element at the time of interleaving, and the shift register sequentially shifts, by one bit, a bit sequence having already been stored and sequentially stores a 1-bit data element sequentially output from the data selection expansion means at the time of interleaving; when the bit width of the bit sequence stored in the shift register reaches a predetermined bit width, not smaller than the bit width of at least 1-word data, the bit sequence is stored as part of the second data in the data storage means.

The above-mentioned third and fourth interleaving/deinterleaving apparatuses are configured so that the components of the first and second interleaving/deinterleaving apparatuses described before are used in common. There is a reverse conversion relationship between interleaving and deinterleaving with respect to the placement of data elements. Hence, in the case when the same address information and bit position information are provided for the access information supply means of the first and second interleaving/deinterleaving apparatuses, one of the apparatuses can carry out interleaving and the other can carry out deinterleaving. In the conventional example and the first and second interleaving/deinterleaving apparatuses, in order that selection is made between interleaving and deinterleaving, it is necessary to rewrite the address information and the bit position information. However, in the third and fourth interleaving/deinterleaving apparatuses, such rewriting is not necessary.

BRIEF DESCRIPTION OF DRAWINGS

FIG. 5 is a table illustrating the placement of data elements at the time of deinterleaving in accordance with the first embodiment of the present invention;

FIG. 6 is a table illustrating the storage information of address storage means at the time of deinterleaving in accordance with the first embodiment of the present invention;

FIG. 7 is a table illustrating the placement of data elements at the time of interleaving in accordance with the first embodiment of the present invention;

FIG. 8 is a table illustrating the storage information of the address storage means at the time of interleaving in accordance with the first embodiment of the present invention;

FIG. 9 is a table illustrating the storage information of address storage means at the time of deinterleaving in accordance with the second embodiment of the present invention;

FIG. 10 is a table illustrating the storage information of the address storage means at the time of interleaving in accordance with the second embodiment of the present invention;

FIG. 11 is a table illustrating a program in accordance with the first embodiment of the present invention;

FIG. 12 is a table illustrating a program in accordance with the second embodiment of the present invention;

FIG. 14 is a table illustrating a program in accordance with the conventional example.

DESCRIPTION OF PREFERRED EMBODIMENTS

Figure 1:
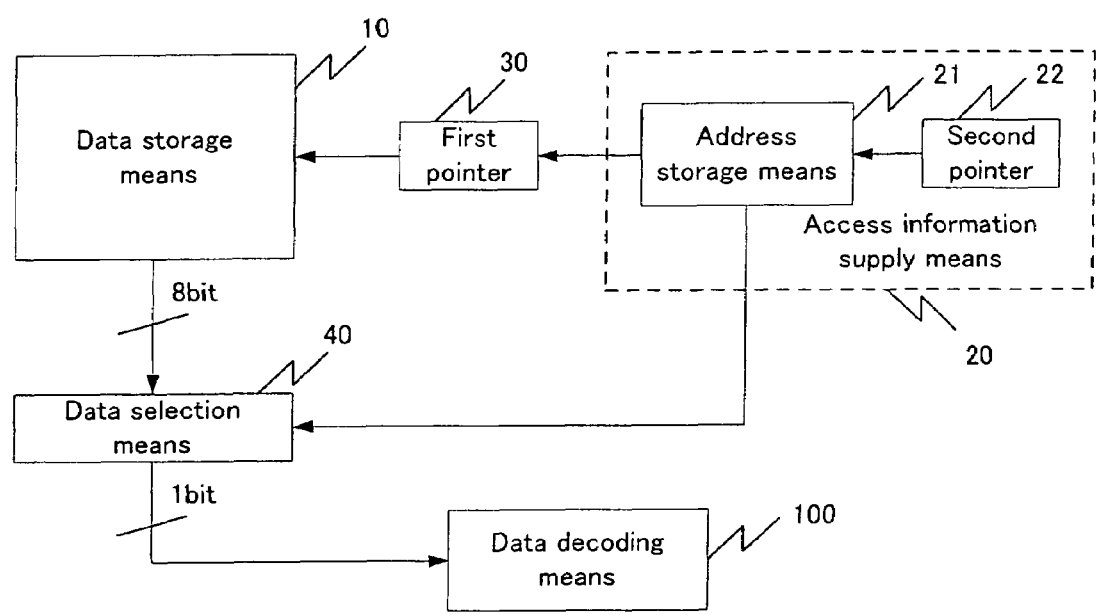
FIG. 1 is a schematic diagram showing an interleaving/deinterleaving apparatus in accordance with a first example of a first embodiment of the present invention.

Embodiments in accordance with the present invention will be described below referring to the drawings.

First Embodiment

FIG. 1 is a schematic diagram showing an interleaving/deinterleaving apparatus in accordance with a first embodiment. For the sake of simplicity, explanations are first given on the assumption that deinterleaving is carried out.

A data storage means 10 holds interleaved reception data. Read/write access is possible at the address designated by a first pointer 30.

An access information supply means 20 comprises address storage means 21 and a second pointer 22. The address storage means 21 holds address information and bit position information for access to the elements of reception data in sequence in consideration of the arrangement of the data elements of deinterleaved data in accordance with the sequence of the addresses of the address storage means 21. The address storage means 21 outputs the address information and the bit position information stored at the address designated by the second pointer 22. The second pointer 22 first designates the head address of the address storage means 21 and is incremented by one each time processing is carried out. In this way, the access information supply means 20 outputs the address information of the data storage means 10 to the first pointer 30 and outputs the bit position information to data selection means 40 described later.

The data selection means 40 selects the data element in the bit position designated by the bit position information from 1-word data read from the data storage means 10 and outputs the data element. The bit sequence continuously processed in this way has already become a deinterleaved data sequence and is directly supplied to data decoding means 100 provided externally.

Figure 2:
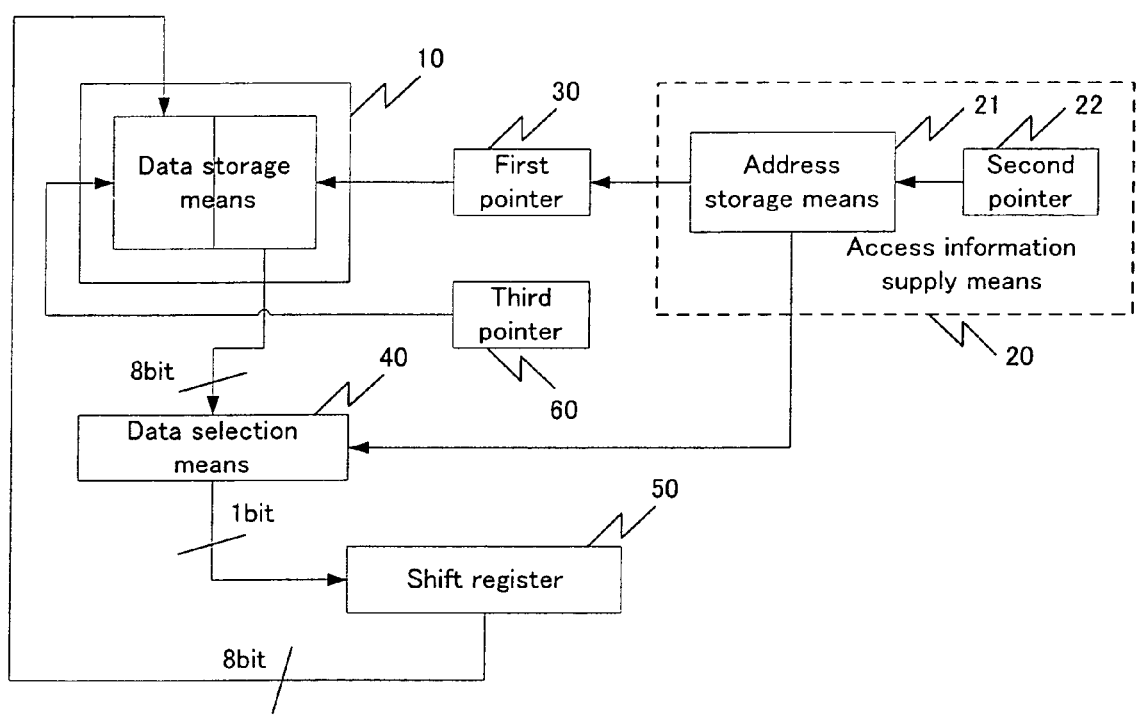
FIG. 2 is a schematic diagram showing an interleaving/deinterleaving apparatus in accordance with a second example of the first embodiment of the present invention.

FIG. 2 is a schematic diagram in accordance with the first embodiment provided with a function of storing deinterleaved data in the data storage means 10. In the case when the above-mentioned data decoding means 100 cannot process deinterleaved data in time sequence because of operation timing, processing procedure, etc., the data is required to be stored in the data storage means once. A shift register 50 shifts the data elements, having already been stored, to higher-order bits by one bit and stores a new data element output from the data selection means 40 in the least significant bit. After 1-word data is stored by the repetition of this processing, the data is output to the data storage means 10. The third pointer 60 first designates the head address of the storage area in which deinterleaved data is stored. When the 1-word data output from the shift register 50 is stored at the corresponding address in the data storage means 10, the address information having been held is incremented by one and thus renewed to designate the next address.

FIG. 5 is a table illustrating the placement of data elements stored in the data storage means 10 before and after processing at the time of deinterleaving. For the sake of simplicity, it is herein assumed that the bit width of one word is eight bits, that the data width subjected to deinterleaving is 32 bits, and that reception data has already been interleaved by block interleaving wherein the column direction of the data is converted into the row direction. Hence, deinterleaving is carried out by converting the row direction of the data into the column direction. In addition, it is assumed that the reception data is stored at address 100 and the subsequent addresses in the data storage means 10, that deinterleaved data is stored at address 300 and the subsequent addresses, and that the data elements of the reception data are d0, d1, d2, . . . , d31 in sequence, beginning with the head thereof. Furthermore, in actual storage means, plural words (plural addresses) are arranged physically in the row direction. However, one row is used for one word (one address) for the sake of simplicity.

In the case when the data elements in the sequence of d0, d1, d2, . . . before deinterleaving are deinterleaved, their respective storage destinations are bit 7 of address 300, bit 7 of address 301, bit 7 of address 302, bit 7 of address 303, . . . of the data storage means 10. It is thus understood that preprocessing is required to write data to the data storage means 10 in word units just as in the case of the conventional example.

When the sequence of the data elements to be deinterleaved is d0, d4, d8, . . . in consideration of the arrangement after the processing and the data elements are deinterleaved, the deinterleaved data elements can be directly supplied to the data decoding means 100 in the case of FIG. 1. Even in the case of storing the data elements in the data storage means 10 in the case of FIG. 2, their respective storage destinations are bit 7 of address 300, bit 6 of address 300, bit 5 of address 300, . . . It is thus understood that after the data elements of 1-word data are stored in the shift register 50 in sequence, the 1-word data should only be written at address 300 of the data storage means 10.

FIG. 6 is a table illustrating the address information and the bit position information held in the address storage means 21 constituting the access information supply means 20 at the time of deinterleaving. The second pointer 22 first designates address 0 of the address storage means 21. The access information supply means 20 outputs 100 as the address information of the data storage means 10 to the first pointer 30 and outputs bit 7 as the bit position information. The second pointer 22 is updated so as to designate the next address. In this way, the first pointer 30 designates address 100, and the 1-word data [d0, d1, d2, d3, d4, d5, d6, d7] stored at address 100 is read from the data storage means 10. The data selection means 40 refers to bit 7 serving as bit position information and selects and outputs d0. After this, similarly, deinterleaved data elements are output in the sequence of d4, d8, d12, . . . in accordance with the address information and the bit position information stored in the address storage means 21. In order that these data elements are stored in the data storage means 10, after the data elements of one word are stored in the shift register 50, the data elements should only be written in the data storage means 10. At that time, the third pointer 60 first designates address 300 of the data storage means 10. After the data is written at address 300, the third pointer 60 is updated so as to designate address 301.

The data selection means 40 may be configured by using a shifter, wherein the 1-word data read from the data storage means 10 is shifted toward the least significant bit by the bit position value designated by the bit position information so that the necessary data element is always positioned in the least significant bit of output data, and the least significant bit is supplied to the data decoding means 100 or the shift register 50.

In the first embodiment, deinterleaving can be carried out as described above. Since interleaving is the reverse of deinterleaving and is different from deinterleaving only in address information and bit position information, interleaving can be carried out by using a similar procedure.

FIG. 7 is a table illustrating the placement of data elements stored in the data storage means 10 before and after processing at the time of interleaving. Data elements before interleaving are written at address 100 and the subsequent addresses, and data elements after interleaving are written at address 300 and the subsequent addresses. Since interleaving is carried out, the column direction of data is converted into the row direction.

FIG. 8 is a table illustrating the address information and the bit position information held in the address storage means 21 constituting the access information supply means 20 at the time of interleaving. The address information and the bit position information are determined in consideration of the arrangement of interleaved data elements.

The access information supply means 20 herein comprises the address storage means 21 and the second pointer 22. However, since both the address information and the bit position information are changed in accordance with predetermined rules as shown in FIGS. 6 and 8, the address information and the bit position information may be generated by counting the number of processing for data elements.

FIG. 11 is a table illustrating a program in accordance with the first embodiment. At step 0, the address information supplied by the access information supply means 20 is set at the first pointer 30, and the second pointer 22 is incremented by one.

At step 1, the number of repetitions is set at a preset number so that the processing is repeated by the number corresponding to the bit width of one word.

At step 2, the 1-word data stored at the address, designated by the third pointer 60, of the data storage means 10 is read, the data element in the bit position designated by the bit position information is selected by the data selection means 40 and output to the shift register 50. The next address information supplied by the access information supply means 20 is set at the first pointer 30, and the second pointer 22 is incremented by one. If the number of repetitions is not more than the preset number, the procedure returns to the start of step 3. If the number of repetitions is more than the preset number, the next step, step 3, is then carried out.

At step 3, the 1-word data of the shift register 50 is transferred to the address, designated by the third pointer 60, of the data storage means 10, and the third pointer 60 is incremented by one.

At step 4, if deinterleaving/interleaving has not been carried out for all the data elements, the procedure returns to step 1. If deinterleaving/interleaving has been carried out, the program ends. The program comprises the above-mentioned processing steps.

FIG. 11 illustrates the program in the case of the configuration shown in FIG. 2. However, in the case when the third pointer 60 and the shift register 50 are not provided and when the output data from the data selection means 40 is not written in the data storage means 10, only step 3 in FIG. 11 is not required, whereby step 2 goes to step 4. However, in this case, the data element selected by the data selection means 40 at step 2 is output to the outside (the data decoding means 100 in the example shown in FIG. 1) instead of the shift register 50.

When FIG. 11 is compared with FIG. 14 serving as the table illustrating the program in accordance with the conventional example, it is found that the number of steps is fewer by two. Furthermore, in the first embodiment, step 2 is repeated by the number of times corresponding to the bit width of one word when 1-word data is interleaved/deinterleaved. However, in the conventional example, the processing in the sequence of step 3, step 4 and step 5 is repeated. Hence, it is found that the total number of processing steps can be further reduced in proportion to the size of data to be processed.

As described above, in the first embodiment, by devising a data accessing method, logical operation means is made unnecessary, unlike the case of the conventional example. It is thus possible to reduce the size of the circuit, the number of the processing steps and the number of the total processing steps of the program.

Second Embodiment

Figure 3:
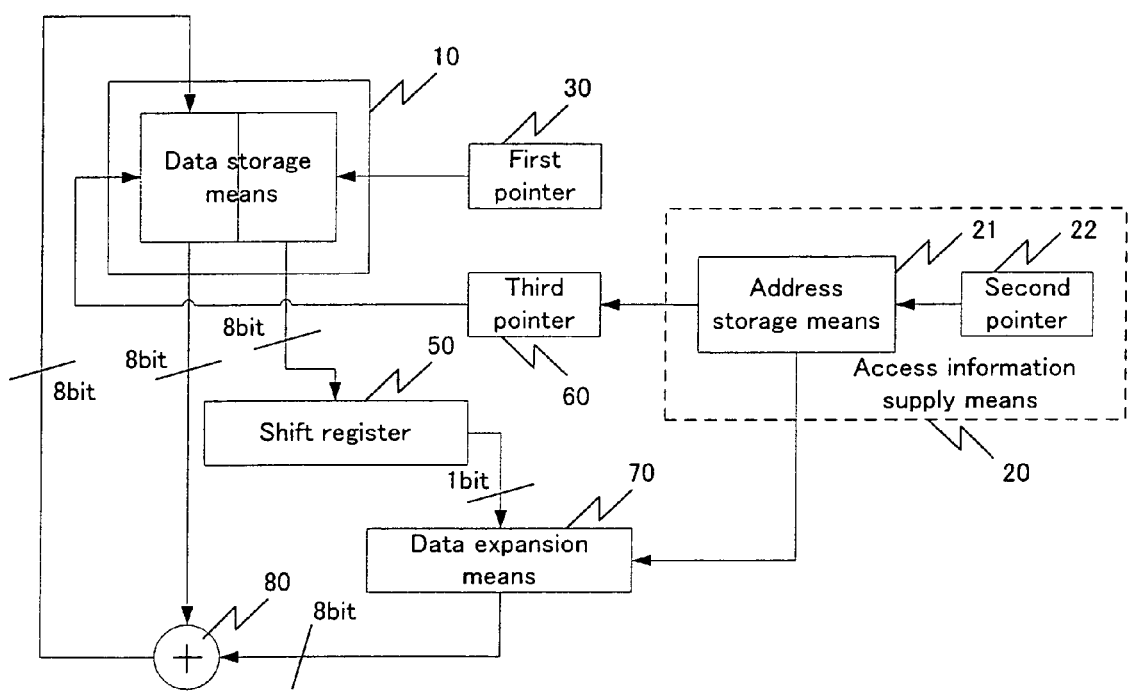
FIG. 3 is a schematic diagram showing an interleaving/deinterleaving apparatus in accordance with a second embodiment of the present invention.

FIG. 3 is a schematic diagram showing an interleaving/deinterleaving apparatus in accordance with a second embodiment. For the sake of simplicity, explanations are first given on the assumption that deinterleaving is carried out, just as in the case of the first embodiment.

A data storage means 10 holds interleaved reception data. The storage area in which interleaved data is stored is initialized by value 0. Read/write access is possible at the addresses designated by a first pointer 30 and a third pointer 60.

An access information supply means 20 comprises address storage means 21 and a second pointer 22. The address storage means 21 holds address information and bit position information for storage of processed data elements in sequence in consideration of the arrangement of the data elements of reception data in accordance with the sequence of the addresses of the address storage means 21. The address storage means 21 outputs the address information and the bit position information stored at the address designated by the second pointer 22. The second pointer 22 first designates the head address of the address storage means 21 and is incremented by one each time processing is carried out. In this way, the access information supply means 20 outputs the address information of the data storage means 10 to the third pointer 60 and outputs the bit position information to data expansion means 70 described later.

The 1-word data of the reception data read from the address designated by the first pointer 30 is stored in a shift register 50. The shift register 50 supplies the data elements to the data expansion means 70 while shifting the stored data to higher-order bits, one bit at a time.

The data expansion means 70 outputs 1-word data wherein the data element output from the shift register 50 is placed in the bit position designated by the bit position information and value 0 is placed at the other bit positions.

Logical OR means 80 computes the OR of the 1-word data read from the address designated by the third pointer 60 with the 1-word data output from the data expansion means 70. The data storage means 10 stores the 1-word data output from the logical OR means 80 at the address designated by the third pointer 60.

FIG. 9 is a table illustrating the address information and the bit position information held in the address storage means 21 constituting the access information supply means 20 at the time of deinterleaving. The second pointer 22 first designates address 0 of the address storage means 21. The access information supply means 20 outputs 300 as the address information of the data storage means 10 to the third pointer 60 and outputs bit 7 as the bit position information. The second pointer 22 is updated so as to designate the next address. The first pointer 30 first designates address 100 and is updated so as to designate address 101 after the 1-word data [d0, d1, d2, d3, d4, d5, d6, d7] stored at address 100 (see FIG. 5) of the data storage means 10 is read. The 1-word data read from address 100 is stored in the shift register 50, and the shift register 50 shifts out the data, whereby the data is supplied to the data expansion means 70 in the sequence of d0, d1, d2, . . .

The data expansion means 70 generates and outputs 1-word data [d0, 0, 0, 0, 0, 0, 0, 0] wherein data element d0 is placed at bit 7 in accordance with data element d0 and bit 7 of the bit position information supplied and value 0 is placed at the other bit positions. The third pointer 60 designates address 300 on the basis of the address information. Initialized 1-word data [0, 0, 0, 0, 0, 0, 0, 0] stored at address 300 is read from the data storage means 10. The logical OR means 80 computes the OR of the 1-word data [0, 0, 0, 0, 0, 0, 0, 0] with the 1-word data [d0, 0, 0, 0, 0, 0, 0, 0] and outputs 1-word data [d0, 0, 0, 0, 0, 0, 0, 0]. The data storage means 10 stores the data output from the logical OR means 80 at address 300 designated by the third pointer 60. The third pointer 60 is updated so as to designate address 301 on the basis of the next address information.

The data expansion means 70 may be configured by using a shifter, wherein the data element supplied from the shift register 50 is shifted toward the most significant bit by the bit position value designated by the bit position information, the bits higher than the bit position of the data element are 0-expanded (0 is set at the higher-order bits), the lower-order bits are 0-padded (0 is set at the lower-order bits), and the obtained data is output as 1-word data.

In the second embodiment, deinterleaving can be carried out as described above. In addition, since interleaving is different from deinterleaving only in address information and bit position information, interleaving can be carried out by using a similar procedure.

FIG. 10 is a table illustrating the address information and the bit position information held in the address storage means 21 constituting the access information supply means 20 at the time of interleaving in, the second embodiment.

The access information supply means 20 herein comprises the address storage means 21 and the second pointer 22. However, since both the address information and the bit position information are changed in accordance with predetermined rules as shown in FIGS. 9 and 10, the address information and the bit position information may be generated by counting the number of processing for data elements.

FIG. 12 is a table illustrating a program in accordance with the second embodiment. The storage area, in which processed data is stored, of the data storage means 10, hereafter referred to as a processed data storage area, is initialized at step 0 and step 1.

At step 0, the number of repetitions for the initialization is set at a preset number (1) so that all the processed data storage areas are initialized, and the address information supplied by the access information supply means 20 is set in the third pointer 60. The address information to be set at this time is the head address of the processed data storage area.

At step 1, value 0 is stored at the address (1-word data storage area), designated by the third pointer 60, of the data storage means 10, and the third pointer 60 is incremented by one. If the number of repetitions is not more than the preset number (1), the procedure returns to the start of step 1. If the number of repetitions is more than the preset number (1), the processing at the next step, step 2, is carried out.

At step 2, the address information supplied by the access information supply means 20 is set at the third pointer 60, and the second pointer 22 is incremented by one.

At step 3, the 1-word data stored at the address, designated by the first pointer 30, of the data storage means 10 is read and stored in the shift register 50, and the first pointer 30 is incremented by one.

At step 4, the number of repetitions is set at a preset number (2) so that the processing is repeated by the number corresponding to the bit width of one word.

At step 5, the logical OR means 80 computes the OR of the 1-word data read from the address, designated by the third pointer 60, of the data storage means 10 with the 1-word data output from the data expansion means 70. The OR is stored at the address, designated by the third pointer 60, of the data storage means 10. This stored data output from the logical OR means 80 is data obtained by setting the 1-bit output value of the shift register 50 in the bit position that is included in the 1-word data (all the data elements are 0) read from the address, designated by the third pointer 60, of the data storage means 10 and is designated by the bit position information. Furthermore, the next address information supplied by the access information supply means 20 is set at the third pointer 60, and the second pointer 22 is incremented by one. If the number of repetitions is not more than the preset number (2), the procedure returns to the start of step 5. If the number of repetitions is more than the preset number (2), the processing at the next step, step 6, is carried out.

At step 6, if deinterleaving/interleaving has not been carried out for all the data elements, the procedure returns to step 3. If deinterleaving/interleaving has been carried out, the program ends. The program comprises the above-mentioned processing steps.

When FIG. 12 is compared with FIG. 14 serving as the table illustrating the program in accordance with the conventional example, it is found that the number of processing steps is the same. In the following description, FIG. 12 is compared with FIG. 14 with respect to the number of the total processing steps. First, in the second embodiment, initialization steps are required. Since the total number of data elements divided by the number of bits in one word is the number of repetitions, the number of initialization steps is "2×32/8=8" in this case. On the other hand, the number of repetitions of a step of processing each data element directly becomes the total number of data elements. This number is 32 in the second embodiment and "3×32=96" in the conventional example. Hence, even if the number of processing steps is increased at the initialization steps, the effect of decreasing the number of steps for processing each data element is more significant. It is thus found that the number of total steps can be made smaller than that in the conventional example.

In the second embodiment, the storage area in which processed data is stored is initialized by value 0 beforehand as described above. Hence, regardless of whether the data element to be processed is 0 or 1, data expansion can be carried out by the same procedure, and logical operation can be limited to logical OR operation. Therefore, in comparison with the conventional example, logical operation means and the like can be simplified, and the size of the circuit can be reduced. Furthermore, the number of total processing steps can be reduced, although the effect of the reduction is less significant than that of the first embodiment since the initialization steps for the data storage means 10 are required.

Third Embodiment

Figure 4:
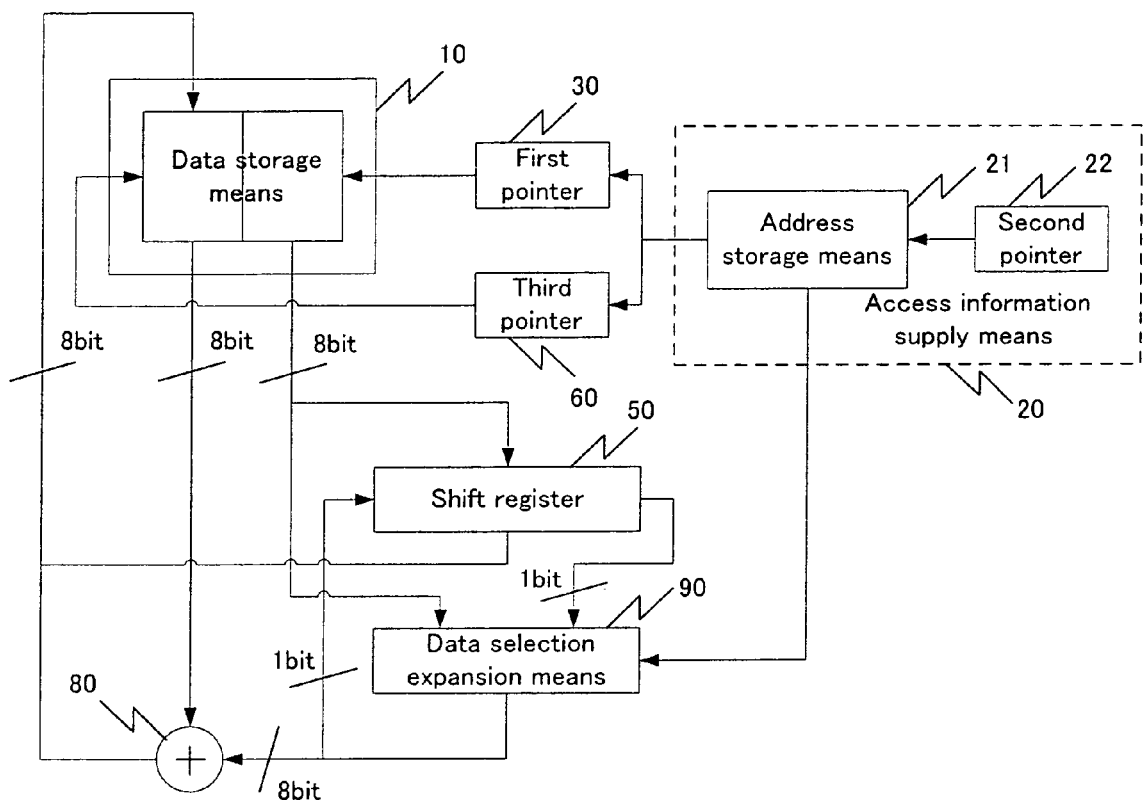
FIG. 4 is a schematic diagram showing an interleaving/deinterleaving apparatus in accordance with a third embodiment of the present invention.
Figure 13:
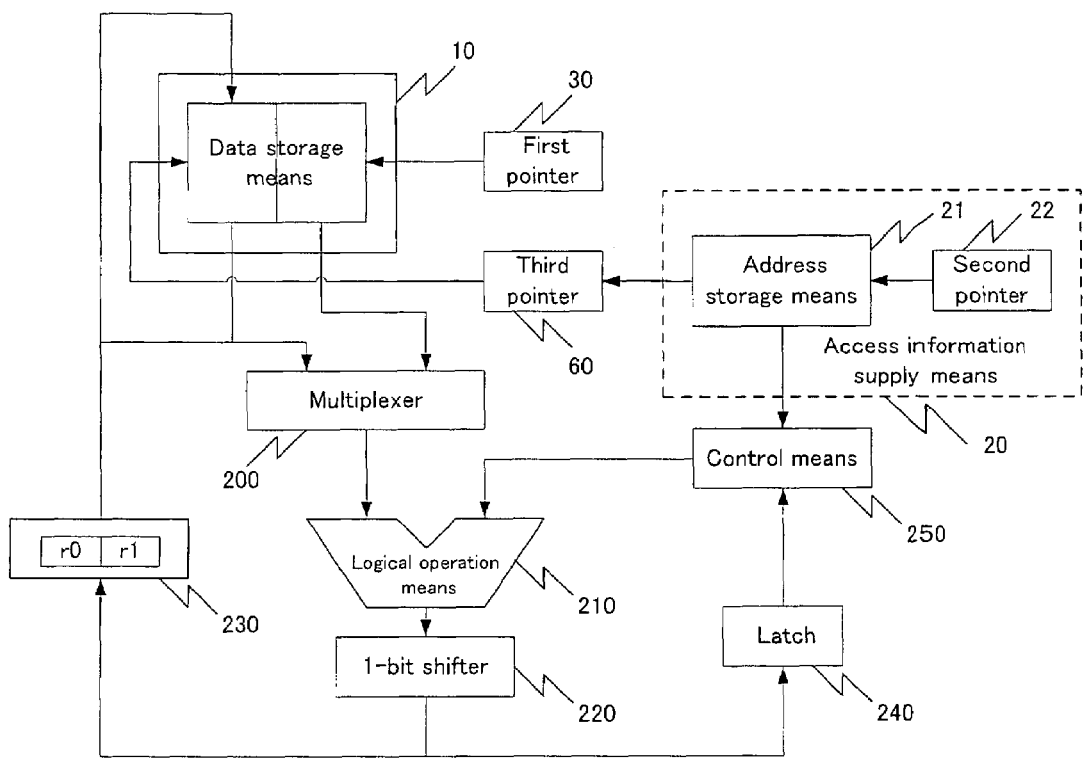
FIG. 13 is a schematic diagram showing the configuration of the conventional example.

FIG. 4 is a schematic diagram showing a deinterleaving/interleaving apparatus in accordance with a third embodiment. This embodiment is configured so that the components of the first and second embodiments are used in common. Data selection expansion means 90 is configured so as to have both the function of the data selection means 40 in accordance with the first embodiment and the function of the data expansion means 70 in accordance with the second embodiment. Furthermore, the shift register 50 shown in FIG. 4 is configured so as to have both the function of the shift register 50 shown in FIG. 2 and the function of the shift register 50 shown in FIG. 3. Still further, in this embodiment, the same area (address range) is used as an area (address range) in data storage means 10 for storing data before interleaving at the time of interleaving and also used as an area (address range) in the data storage means 10 for storing data after deinterleaving at the time of deinterleaving.

When interleaving is carried out, the 1-word data corresponding to the address information supplied from an access information supply means 20 via a first pointer 30 is read from the data storage means 10 and sent to the data selection expansion means 90 just as in the case of the first embodiment. At the data selection expansion means 90, the bit corresponding to the bit position information supplied from the access information supply means 20 is selected, and the selected bit is stored in the least significant bit of the shift register 50. The second pointer 22 is then incremented, and the next bit in consideration of the arrangement after interleaving is processed. The shift register 50 shifts its data by one bit and stores the next bit in the least significant bit. After the 1-word data is interleaved, the data is stored at the address, designated by the third pointer 60, of the data storage means 10, and the next word data is processed. In this case, the third pointer 60 is controlled by means not shown just as in the case shown in FIG. 2.

Furthermore, when deinterleaving is carried out, the 1-word data at the address designated by the first pointer 30 is read from the data storage means 10 and sent to the shift register 50 just as in the case of the second embodiment. The shift register 50 shifts out the 1-bit data and supplies the data to the data selection expansion means 90. The data selection expansion means 90 shifts the data to higher-order bits by the bit position value designated by the bit position information of the access information supply means 20. The bits higher than the corresponding bit position are 0-expanded, the lower-order bits are 0-padded, and the obtained data is output as 1-word data to the logical OR means 80. The logical OR means 80 computes the OR of the 1-word data output from the data selection expansion means 90 with the 1-word data at the address, designated by the third pointer 60, of the data storage means 10. The OR is written at the address, designated by the third pointer 60, of the data storage means 10. In this case, the first pointer 30 is controlled by means not shown just as in the case shown in FIG. 3. Furthermore, the third pointer 60 designates the address in accordance with the address information supplied from the access information supply means 20 just as in the case shown in FIG. 3.

Owing to the above-mentioned configuration, the data selection expansion means 90 can attain both the function of the data selection means 40 and the function of the data expansion means 70, and the shift register 50 shown in FIG. 4 can attain both the function of the shift register 50 shown in FIG. 2 and the function of the shift register 50 shown in FIG. 3. Hence, the third embodiment can carry out both the processing in the first embodiment and the processing in the second embodiment described above.

When FIG. 6 showing the address information and the bit position information stored in the address storage means 21 at the time of deinterleaving in the first embodiment is compared with FIG. 10 showing the address information and the bit position information stored in the address storage means 21 at the time of interleaving in the second embodiment, the bit position information has the same setting, although there is a difference between the first embodiment and the second embodiment in that data is read from addresses 100s in the first embodiment and that data is written to addresses 300s in the second embodiment. A similar matter can also be said when FIG. 8 is compared with FIG. 9.

In other words, in this embodiment, the same area (address range) is used as the data reading destination at the time of interleaving and also used as the data writing destination at the time of deinterleaving. Furthermore, interleaving is carried out by using processing similar to that of the first embodiment, and deinterleaving is carried out by using processing similar to that of the second embodiment. In the cases of the conventional example and the above-mentioned first and second embodiments, two kinds of address information for interleaving and deinterleaving are stored in the address storage means and selectively used depending on whether the processing is interleaving or deinterleaving. In the cases of this embodiment, however, the selection depending on whether the processing is interleaving or deinterleaving is not required. Therefore, the amount of information to be stored in the address storage means can be decreased, whereby the size of the circuit can be reduced.

Since the same area is used as the data reading destination at the time of interleaving and also used as the data writing destination at the time of deinterleaving in the third embodiment, no problem occurs when interleaving or deinterleaving is carried out individually. However, interleaving and deinterleaving cannot be carried out simultaneously. In order that this problem is solved, address information may be offset only when deinterleaving is carried out.

For example, it is assumed that the address storage means in accordance with the third embodiment stores the address information and the bit position information shown in FIG. 8. When interleaving is carried out, data to be interleaving is read from addresses 100s. When deinterleaving is carried out, deinterleaved data is written at the same addresses, i.e., addresses 100s. These cannot be carried out simultaneously as a matter of course. However, by using a configuration wherein the address information is offset by the amount of 200 addresses at the time of deinterleaving, deinterleaved data is written at addresses 300s, whereby interleaving and deinterleaving can be carried out simultaneously. Even in this case, since the address information is only offset, the size of the circuit is made smaller than that of the circuit for storing two kinds of address information for interleaving and deinterleaving. It is needless to say that the third embodiment may be configured so that the address information is offset only at the time of interleaving.

The present invention is not limited to the above-mentioned embodiments. For example, a general-purpose processor may also be used for processing, instead of the interleaving/deinterleaving apparatuses in accordance with the above-mentioned embodiments. Even in that case, an effect of decreasing the number of processing steps can be obtained as described referring to FIGS. 11 and 12.

The invention claimed is:

1. An interleaving/deinterleaving method for interleaving/deinterleaving first data stored in data storage means to second data so that an arrangement of data elements of said second data is different from an arrangement of data elements of said first data in bit units, comprising:

a first step of reading word data, part of said first data, from said data storage means, and a second step of selecting a data element to be processed from said word data read and of outputting said selected data element, a third step of shifting a bit sequence having already been stored in a shift register by one bit and of storing said data element selected and output in said shift register, and a fourth step of storing the bit sequence stored in said shift register in said data storage means after the processing from said first step to said third step is repeated by a predetermined number of times, wherein a sequence of said data elements to be processed at the time of the repetition of the processing from said first step to said third step is determined in accordance with the arrangement of the data elements of said second data.

2. An interleaving/deinterleaving method for interleaving/deinterleaving first data stored in data storage means to second data so that an arrangement of data elements of said second data is different from an arrangement of data elements of said first data, comprising:

a step of initializing an area, in which said second data is stored, of said data storage means, a step of reading word data, part of said first data, from said data storage means in accordance with the arrangement of the data elements of said first data and of storing said word data in a shift register, a step of sequentially shifting out said word data stored in said shift register beginning with the data element positioned in the most significant bit position, a step of generating first word data by positioning said data element shifted out at a bit position in word data serving as said second data and by expanding said data element to word data, a step of reading as second word data the word data stored at the address of said data storage means in which said data element shifted out should be stored, a step of computing a logic OR of said first word data with said second word data, and a step of storing the logical OR result at the address, from which said second word data is read, in said data storage means.

3. An interleaving/deinterleaving apparatus for interleaving/deinterleaving first data stored in data storage means to second data so that an arrangement of data elements of said second data is different from an arrangement of data elements of said first data, comprising:

data storage means for storing said first data, access information supply means for sequentially supplying the address information of word data, part of said first data, in said data storage means and the bit position information of a data element to be processed in said word data, and data selection means for receiving the word data read from the address, corresponding to said address information, of said data storage means, for selecting one data element from said word data on the basis of said bit position information and for outputting said data element, wherein said address information and said bit position information supplied sequentially by said access information supply means are determined in accordance with the arrangement of the data elements of said second data.

4. An interleaving/deinterleaving apparatus in accordance with claim 3, wherein said data elements are processed in bit units, a shift register for sequentially shifting, by one bit, a bit sequence having already been stored and for sequentially storing a 1-bit data element sequentially output from said data selection means is further provided, and when the bit width of said bit sequence stored in said shift register reaches a predetermined bit width, not smaller than the bit width of at least 1-word data, said bit sequence is stored as part of said second data in said data storage means.

5. An interleaving/deinterleaving apparatus in accordance with claim 3, wherein said data selection means comprises a shifter, said word data read from said data storage means is shifted so that the data element to be selected is positioned at a specific bit position, and the output from said specific bit position after the shifting is used as the output of said data selection means.

6. An interleaving/deinterleaving apparatus for interleaving/deinterleaving first data stored in data storage means to second data so that an arrangement of data elements of said second data is different from an arrangement of data elements of said first data, comprising:

data storage means for storing said first data and said second data, access information supply means for supplying the address information of word data, part of said second data, in said data storage means and the bit position information of a data element to be processed in said word data, a shift register for storing word data, part of said first data, read from said data storage means in accordance with the arrangement of the data elements of said first data and for sequentially shifting out said word data beginning with the data element positioned in the most significant bit position, data expansion means for sequentially expanding said data element shifted out sequentially from said shift register on the basis of said bit position information to word data and for outputting said word data, and logical OR means for computing a logical OR of said word data read from the address, corresponding to said address information, of said data storage means with said word data output from said data expansion means and for outputting the logical OR result, wherein said logical OR result output from said logical OR means is stored at the address, corresponding to said address information, from which said word data is read, of said data storage means, and said address information and said bit position information supplied sequentially by said access information supply means are determined in accordance with the arrangement of the data elements of said first data.

7. An interleaving/deinterleaving apparatus in accordance with claim 6, wherein said data expansion means comprises a shifter, said data element shifted out from said shift register is shifted so as to be positioned in the bit position corresponding to said bit position information, 0 is set in the bits higher and lower than the bit position corresponding to said bit position information, and the obtained data is output as word data.

8. An interleaving/deinterleaving apparatus for interleaving/deinterleaving first data stored in data storage means to second data so that an arrangement of data elements of said second data is different from an arrangement of data elements of said first data, the apparatus comprising:

data storage means for storing said first data and said second data;

access information supply means for supplying address information and bit position information;

a shift register for storing word data, part of said first data, read from said data storage means in accordance with the arrangement of the data elements of said first data and for sequentially shifting out said word data beginning with the data element positioned in the most significant bit position at the time of interleaving;

data selection expansion means for sequentially expanding said data element shifted out sequentially from said shift register on the basis of said bit position information to word data and for outputting said word data at the time of interleaving; and logical OR means for computing a logical OR of word data read from the address, corresponding to said address information, of said data storage means with said word data output from said data selection expansion means and for outputting the logical OR result at the time of interleaving, wherein:

said address information designates an address of word data, part of said second data, in said data storage means at the time of interleaving or designates an address of word data, part of said first data, in said data storage means at the time of deinterleaving, said bit position information designates the bit position of a data element to be processed in said word data, part of said second data, at the time of interleaving or designates the bit position of a data element to be processed in said word data, part of said first data, at the time of deinterleaving, said logical OR result output from said logical OR means is stored at the address, corresponding to said address information, from which said word data is read, of said data storage means, said data selection expansion means receives said word data read from the address, corresponding to said address information, of said data expansion means, selects one data element from said word data on the basis of said bit position information and outputs said data element at the time of deinterleaving, and said shift register sequentially shifts, by one bit, a bit sequence having already been stored and sequentially stores a 1-bit data element sequentially output from said data selection expansion means at the time of deinterleaving, and when the bit width of said bit sequence stored in said shift register reaches a predetermined bit width, not smaller than the bit width of at least 1-word data, said bit sequence is stored as part of said second data in said data storage means.

9. An interleaving/deinterleaving apparatus for interleaving/deinterleaving first data stored in data storage means to second data so that an arrangement of data elements of said second data is different from an arrangement of data elements of said first data, the apparatus comprising:

data storage means for storing said first data and said second data;

access information supply means for supplying address information and bit position information;

a shift register for storing word data, part of said first data, read from said data storage means in accordance with the arrangement of the data elements of said first data and for sequentially shifting out said word data beginning with the data element positioned in the most significant bit position at the time of deinterleaving;

data selection expansion means for sequentially expanding said data element shifted out sequentially from said shift register on the basis of said bit position information to word data and for outputting said word data at the time of deinterleaving; and logical OR means for computing a logical OR of said word data read from the address, corresponding to said address information, of said data storage means with said word data output from said data selection expansion means and for outputting the logical OR result at the time of deinterleaving, wherein:

said address information designates an address of word data, part of said second data, in said data storage means at the time of deinterleaving or designates an address of word data, part of said first data, in said data storage means at the time of interleaving, said bit position information designates the bit position of a data element to be processed in said word data, part of said second data, at the time of deinterleaving or designates the bit position of a data element to be processed in said word data, part of said first data, at the time of interleaving, said logical OR result output from said logical OR means is stored at the address, corresponding to said address information, from which said word data is read, of said data storage means, said data selection expansion means receives said word data read from the address, corresponding to said address information, of said data expansion means, selects one data element from said word data on the basis of said bit position information and outputs said data element at the time of interleaving, and said shift register sequentially shifts, by one bit, a bit sequence having already been stored and sequentially stores a 1-bit data element sequentially output from said data selection expansion means at the time of interleaving, and when the bit width of said bit sequence stored in said shift register reaches a predetermined bit width, not smaller than the bit width of at least 1-word data, said bit sequence is stored as part of said second data in said data storage means.

* * * * *